US011912563B2

United States Patent
Artmann et al.

(10) Patent No.: US 11,912,563 B2
(45) Date of Patent: Feb. 27, 2024

(54) MICROMECHANICAL COMPONENT AND METHOD FOR MANUFACTURING A MICROMECHANICAL COMPONENT

(71) Applicant: Robert Bosch GmbH, Stuttgart (DE)

(72) Inventors: Hans Artmann, Boeblingen-Dagersheim (DE); Christoph Hermes, Kirchentellinsfurt (DE); Heribert Weber, Nuertingen (DE); Jochen Reinmuth, Reutlingen (DE); Peter Schmollngruber, Aidlingen (DE); Thomas Friedrich, Moessingen-Oeschingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 479 days.

(21) Appl. No.: 17/287,389

(22) PCT Filed: Dec. 13, 2019

(86) PCT No.: PCT/EP2019/085101
§ 371 (c)(1),
(2) Date: Apr. 21, 2021

(87) PCT Pub. No.: WO2020/126911
PCT Pub. Date: Jun. 25, 2020

(65) Prior Publication Data
US 2021/0395074 A1  Dec. 23, 2021

(30) Foreign Application Priority Data
Dec. 21, 2018 (DE) .......................... 102018222730.6

(51) Int. Cl.
*B81B 3/00* (2006.01)
*B81C 1/00* (2006.01)
(Continued)

(52) U.S. Cl.
CPC ........ *B81B 3/0072* (2013.01); *B81C 1/00158* (2013.01); *G01L 7/082* (2013.01);
(Continued)

(58) Field of Classification Search
CPC .......... B81B 3/0072; B81B 2201/0264; B81B 2203/0127; B81B 2203/0307; B81C 1/00158; G01L 7/082; G01L 9/0072
See application file for complete search history.

(56) References Cited

U.S. PATENT DOCUMENTS

| 6,460,234 B1 | 10/2002 | Gianchandani |
| 2004/0021402 A1 | 2/2004 | Morley et al. |

(Continued)

FOREIGN PATENT DOCUMENTS

| CN | 102099281 A | 6/2011 |
| CN | 102285632 A | 12/2011 |

(Continued)

OTHER PUBLICATIONS

International Search Report for PCT/EP2019/085101, dated Mar. 17, 2020.

*Primary Examiner* — David Vu
*Assistant Examiner* — Brandon C Fox
(74) *Attorney, Agent, or Firm* — NORTON ROSE FULBRIGHT US LLP; Gerard A. Messina

(57) ABSTRACT

A micromechanical component, whose diaphragm is supported and has support structures on its inner diaphragm side. Each of the support structures includes a first and second edge element structure, and at least one intermediate element structure positioned between the first and second edge element structures. For each of the support structures, a plane of symmetry is definable, with respect to which at least the first edge element structure of the respective support structure and the second edge element structure of (Continued)

the respective support structure are specularly symmetric. In each of support structures, a first maximum dimension of its first edge element structure perpendicular to its plane of symmetry and a second maximum dimension of its second edge element structure perpendicular to its plane of symmetry are greater than the maximum dimension of its intermediate element structure perpendicular to its plane of symmetry.

10 Claims, 10 Drawing Sheets

(51) Int. Cl.
*G01L 7/08* (2006.01)
*G01L 9/00* (2006.01)

(52) U.S. Cl.
CPC .... *G01L 9/0072* (2013.01); *B81B 2201/0264* (2013.01); *B81B 2203/0127* (2013.01); *B81B 2203/0307* (2013.01); *B81C 2201/0101* (2013.01)

(56) References Cited

U.S. PATENT DOCUMENTS

| | | | |
|---|---|---|---|
| 2005/0252302 A1 | 11/2005 | Muchow et al. | |
| 2014/0151822 A1* | 6/2014 | Graham | B81B 3/0021 438/53 |
| 2015/0375991 A1 | 12/2015 | Schelling et al. | |
| 2020/0340875 A1* | 10/2020 | Besling | G01L 9/0042 |

FOREIGN PATENT DOCUMENTS

| | | |
|---|---|---|
| CN | 104024816 A | 9/2014 |
| CN | 105940287 A | 9/2016 |
| DE | 102006022805 A1 | 11/2007 |
| DE | 102009000403 A1 | 7/2010 |
| JP | H0943083 A | 2/1997 |
| JP | 2003207407 A | 7/2003 |
| JP | 2015114318 A | 6/2015 |

* cited by examiner

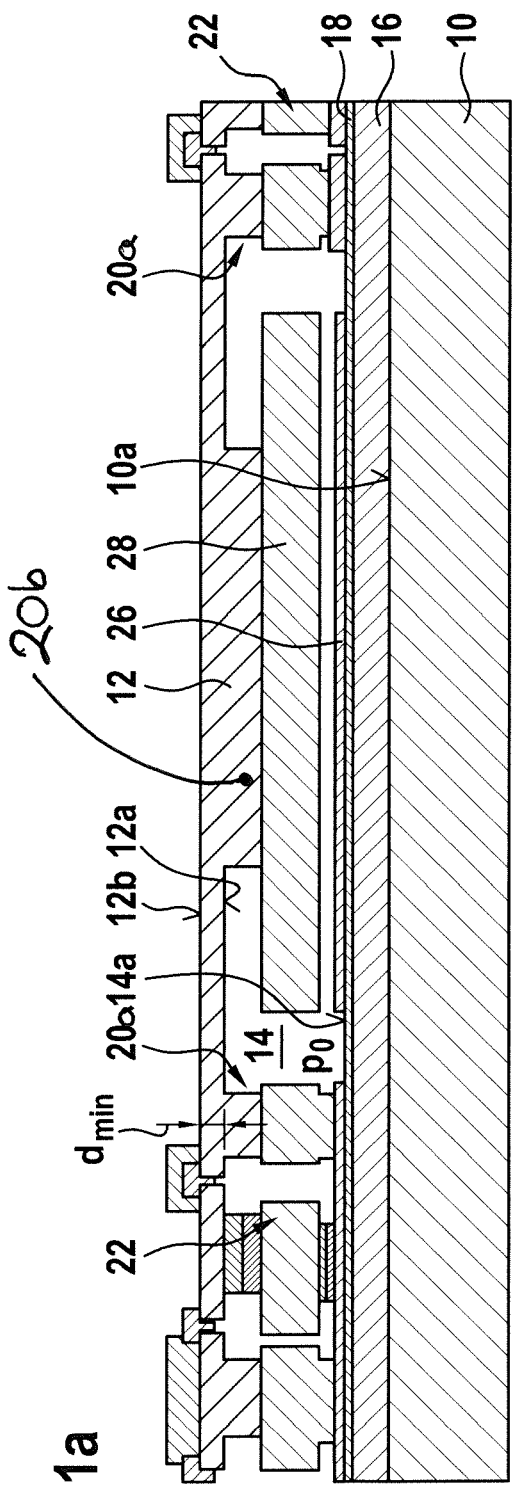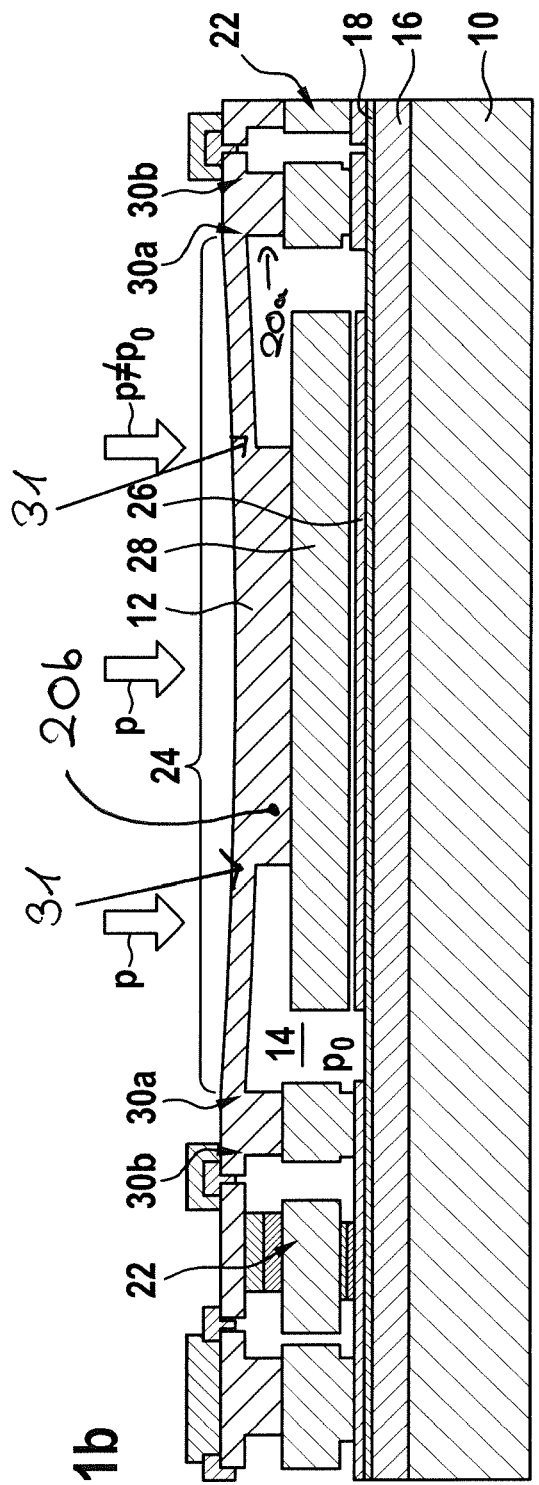

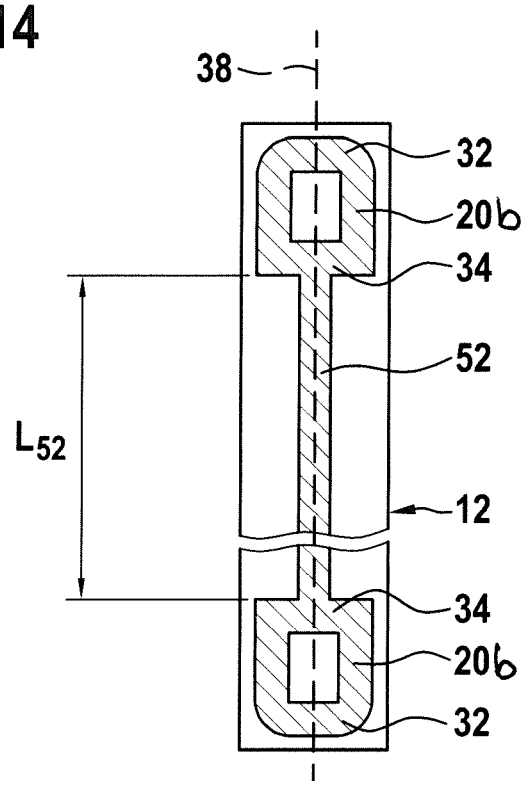
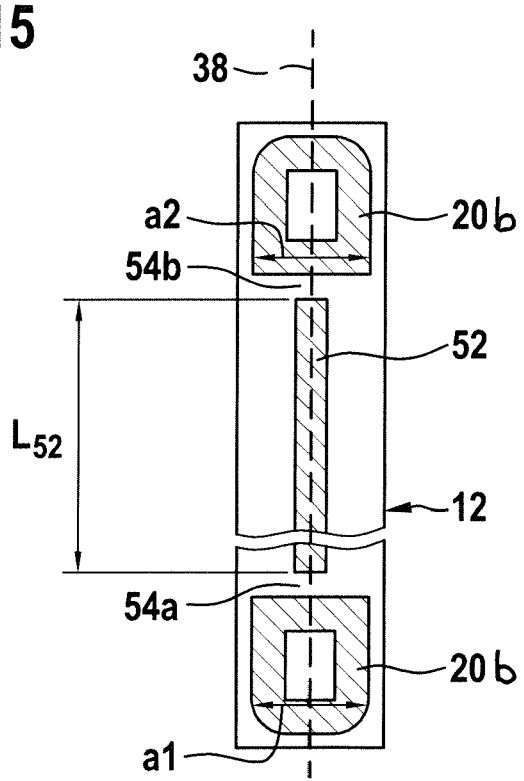

MICROMECHANICAL COMPONENT AND METHOD FOR MANUFACTURING A MICROMECHANICAL COMPONENT

FIELD

The present invention relates to a micromechanical component and a capacitive pressure sensor device. The present invention relates to a method for manufacturing a micromechanical component, as well.

BACKGROUND INFORMATION

German Patent Application No. DE 10 2009 000 403 A1 describes a capacitive pressure sensor that includes a substrate and a diaphragm, which spans a cavity situated between the diaphragm and an upper surface of the substrate. The diaphragm is supported by at least a frame structure, so as to be set apart from the bottom side of the cavity.

SUMMARY

The present invention provides a micromechanical component, a capacitive pressure sensor device, and a method for manufacturing a micromechanical component.

An example embodiment of the present invention provides support structures on an inner diaphragm side of a diaphragm spanning a cavity; the support structures being formed in such a manner, that when the diaphragm is deflected into the cavity and/or bulges out of the cavity, the mechanical stresses occurring directly at the support structures in the diaphragm are spread over a wider area in comparison with the related art. Thus, compared to conventional structures formed on an inner diaphragm side, damage to the diaphragm, such as, in particular, rupturing of the diaphragm, is to be feared less often. Therefore, the present invention contributes towards providing micromechanical components and/or capacitive pressure sensor devices equipped with them, which have a longer service life and/or a higher maximum load than the related art.

In one advantageous specific embodiment of the micromechanical component in accordance with the present invention, the support structures extending from the inner diaphragm side to the bottom side of the cavity are each situated adjacent to a self-supporting region of the diaphragm in such a manner, that in each of the support structures, the adjacent, self-supporting region lies on a side of its first edge element structure pointed away from its at least one intermediate element structure. Due to the advantageous designs/layouts of the support structures extending from the inner diaphragm side to the bottom side of the cavity, in particular, on the basis of their first edge element structures, a high local intensity of mechanical stresses, which could result in damage to the diaphragm, is prevented from occurring in the case of such an orientation of the support structures in the specific boundary region between each of the support structures and the adjacent, self-supporting region.

In particular, at least one of the support structures extending from the inner diaphragm side to the bottom side of the cavity may be positioned adjacent to an outer region of the diaphragm in such a manner, that in the at least one support structure, the adjacent outer region lies on a side of its second edge element structure pointed away from its at least one intermediate element structure. In this case, the boundary region, which is between the at least one support structure positioned in such a manner and the adjacent outer region and is normally highly susceptible to mechanical stresses, is also protected more effectively from possible rupturing of the diaphragm.

Alternatively, or in addition, at least a first of the support structures extending from the inner diaphragm side to the measuring electrode and a second of the support structures extending from the inner diaphragm side to the measuring electrode may be placed in position relative to each other in such a manner, that their second edge element structures are pointed towards each other; a support wall structure extending from the bottom side of the cavity to the inner diaphragm side being formed between their second edge element structures. Consequently, the support structures extending from the inner diaphragm side to the measuring electrode may also be combined to form a comparatively large/large-area overhead suspension of the measuring electrode.

In one further advantageous specific embodiment of the micromechanical component in accordance with the present invention, in at least one of the support structures, its at least one intermediate element structure is connected to its first edge element structure and/or to its second edge element structure. Thus, the at least one intermediate element structure and at least one of the associated edge element structures may form a compact/one-piece overall structure. Alternatively, the at least one support structure and the two associated edge element structures may also be spatially separated from each other.

For example, in at least one of the support structures, its two intermediate element structures may be connected to its first edge element structure and to its second edge element structure in such a manner, that its two intermediate element structures, its first edge element structure, and its second edge element structure frame a hollow space extending from the bottom side of the cavity to the inner diaphragm side. Thus, an "overall circumference" of the hollow-space framing made up of the two intermediate element structures, the first frame element structure and the second frame element structure may be used as a surface of action of mechanical stresses, in order to prevent damage to/a rupture of the diaphragm.

The at least one support structure, whose two intermediate element structures, whose first edge element structure, and whose second edge element structure frame the respective hollow space, may optionally be designed to have at least two round outer edges. Consequently, a local occurrence of mechanical stresses at a sharp outer edge may be prevented.

The cavity is preferably sealed so air-tightly to have a reference pressure present in it, that the diaphragm may be deformed at least partially with the aid of a physical pressure unequal to the reference pressure, on an outer diaphragm side of the diaphragm pointed away from the cavity; a counter-electrode situated on the bottom side of the cavity, and the measuring electrode, being electrically contactable in such a manner, that a voltage applied between the counter-electrode and the measuring electrode may be tapped off. Therefore, the micromechanical component described here may be used advantageously for measuring the physical pressure prevailing, in each instance, on the outer diaphragm side, in that a measured value regarding the physical pressure is determined in view of the voltage tapped off between the counter-electrode and the measuring electrode.

The advantages of the micromechanical component described in the preceding paragraph are also provided in a capacitive pressure sensor device having such a micromechanical component, and in evaluation electronics, which are configured to determine and output a measured value regarding the physical pressure prevailing, in each instance, on the outer diaphragm side, in view of at least the voltage tapped off between the counter-electrode and the measuring electrode.

In addition, the execution of a corresponding method for manufacturing a micromechanical component in accordance with the present invention provides the advantages explained above. In particular, it is emphasized that the manufacturing method according to the specific embodiments of the micromechanical component explained above may be refined further.

BRIEF DESCRIPTION OF THE DRAWINGS

Additional features and advantages of the present invention are explained below in light of the figures.

FIGS. 1a through 1c schematic representations of a first specific embodiment of the micromechanical component, in accordance with the present invention.

FIG. 2 through FIG. 15 show schematic representations of further specific embodiments of the micromechanical component, in accordance with the present invention.

DETAILED DESCRIPTION OF EXAMPLE EMBODIMENTS

Figure 1C:
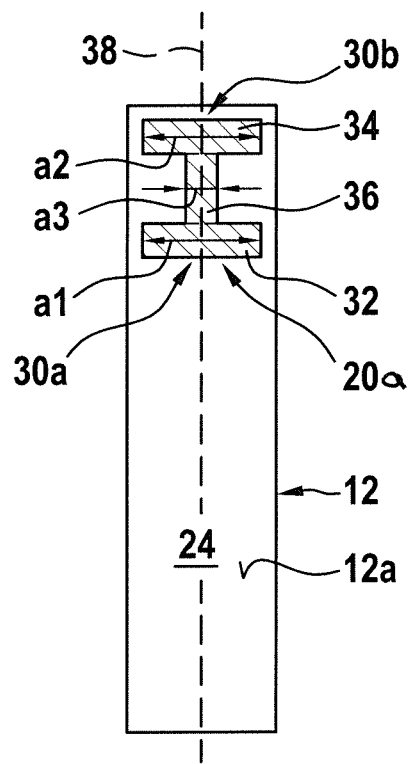

FIG. 1a through 1c show schematic representations of a first specific embodiment of the micromechanical component, in accordance with the present invention.

The micromechanical component schematically represented in FIG. 1a through 1c includes a substrate 10 having an upper substrate surface 10a. Substrate 10 is preferably a semiconductor substrate, such as, in particular, a silicon substrate. However, it should be pointed out that instead of, or in addition to, silicon, substrate 10 may also include at least one further semiconductor material, at least one metal, and/or at least one electrically insulating material.

The micromechanical component also includes a diaphragm 12, which spans a cavity 14 lying between diaphragm 12 and upper substrate surface 10a, so as to be set apart from a bottom side 14a of cavity 14 pointed away from diaphragm 12. However, the position of cavity 14 between diaphragm 12 and upper substrate surface 10a does not have to be understood to mean that bottom side 14a of cavity 14 borders directly on upper substrate surface 10a. Instead, at least one more layer 16 and 18, such as at least one insulating layer 16 and 18, which covers upper substrate surface 10a at least partially, may be situated between bottom side 14a of cavity 14 and upper substrate surface 10a of substrate 10. In particular, the at least one insulating layer 16 and 18 may be a silicon oxide layer and/or a (silicon-rich) silicon nitride layer.

The micromechanical component also includes a plurality of support structures 20a and 20b, which each extend from an inner diaphragm side 12a of diaphragm 12 to bottom side 14a of cavity 14 and/or from inner diaphragm side 12a to a measuring electrode 28 suspended on diaphragm 12. Inner diaphragm side 12a is to be understood as a side of diaphragm 12 oriented towards substrate 10. Support structures 20a and 20b may gradually change, in particular, into diaphragm 12, which means that inner diaphragm side 12a may also be understood as a "virtual boundary plane," which is situated at a distance from an outer diaphragm side 12b pointed away from substrate 10; the distance being equal to a minimum layer thickness $d_{min}$ of diaphragm 12 perpendicular to upper substrate surface 10a. Diaphragm 12 is held apart from bottom side 14a of cavity 14 with the aid of at least the first support structures 20a extending from inner diaphragm side 12a of diaphragm 12 to bottom side 14a of cavity 14. The second support structures 20b extending from inner diaphragm side 12a to measuring electrode 28 are used for "electrode suspension." Each of support structures 20a and 20b is joined separately to diaphragm 12. In the same way, each of first support structures 20a is anchored separately to bottom side 14a of cavity 14, and each of second support structures 20b is anchored separately to measuring electrode 28.

In the specific embodiment of FIG. 1a through 1c, cavity 14 is sealed, for example, in an air-tight manner. To that end, for example, a frame structure 22, which is not discussed here in further detail, may seal cavity 14 in such an air-tight manner, that a reference pressure $p_0$ is enclosed in cavity 14. Therefore, as is apparent in FIG. 1b, at least one self-supporting region 24 of diaphragm 12 is deformable with the aid of a physical pressure p on outer diaphragm side 12b unequal to reference pressure $p_0$. The deformation of at least self-supporting region 24 of diaphragm 12 due to the physical pressure p unequal to reference pressure $p_0$ acting upon it is detectable, by tapping off a voltage between a counter-electrode 26 situated on bottom side 14a of cavity 14, and measuring electrode 28. To that end, counter-electrode 26 and measuring electrode 28 are electrically contactable in such a manner, that the voltage applied between counter-electrode 26 and measuring electrode 28 may be tapped off. Subsequently, a measured value regarding the physical pressure p prevailing, in each instance, on outer diaphragm side 12b may be determined in view of at least the tapped-off voltage. Consequently, the micromechanical component of FIG. 1a through 1c may advantageously be used as at least part of a capacitive pressure sensor device. However, it is emphasized that the usefulness of the micromechanical components explained in light of the figures described here and subsequent figures is not limited to capacitive sensor devices.

As is apparent in FIG. 1b, in response to deformation of at least self-supporting region 24 of diaphragm 12, mechanical stresses occur in the specific "inner" boundary region 30a between each of first support structures 20a and self-supporting region 24. In the same way, in response to deformation of at least self-supporting region 24 of diaphragm 12, mechanical stresses may also occur in the specific "outer" boundary region 30b between each of first support structures 20a and an outer region of diaphragm 12, such as an edge of the diaphragm at frame structure 22. In response to deformation of at least self-supporting region 24 of diaphragm 12, mechanical stresses may also occur in the specific "outer" electrode-suspension boundary region 31 adjacent to each of second support structures 20b. However, as explained in more detail below, the risk of damage to diaphragm 12 due to mechanical stresses, in particular, the risk of rupturing diaphragm 12 due to mechanical stresses, may be reduced significantly with the aid of an advantageous design of support structures 20a and 20b.

In the micromechanical component, each of the first and second support structures 20a and 20b is configured with, in each instance, a first edge element structure 32, a second edge element structure 34, and at least one intermediate element structure 36 situated between associated, first edge element structure 32 and associated second edge element structure 34. FIG. 1c shows an example of one of first support structures 20a; the substructures 32 through 36 of each first support structure 20a each extending from inner diaphragm side 12a of diaphragm 12 to bottom side 14a of cavity 14. However, it is emphasized here that second support structures 20b may also include the features described below; in this case, substructures 32 through 36 of each second support structure 20b each extending from inner diaphragm side 12a of diaphragm 12 to measuring electrode 28.

In each instance, a plane of symmetry 38, with respect to which at least first edge element structure 32 of respective support structure 20a or 20b and second edge element structure 34 of respective support structure 20a or 20b are specularly (mirror) symmetric, may be defined for each of support structures 20a and 20b. As an option, the at least one intermediate element structure 36 may also be formed specularly symmetrically with respect to plane of symmetry 38. Plane of symmetry 38 intersects bottom side 14a of cavity 14 and inner diaphragm side 12a of diaphragm 12. In particular, plane of symmetry 38 may be oriented perpendicularly to upper substrate surface 10a of substrate 10.

In addition, in each of support structures 20a and 20b, a first maximum dimension a1 of its first edge element structure 32 perpendicular to its plane of symmetry 38 and a second maximum dimension a2 of its second edge element structure 34 perpendicular to its plane of symmetry 38 are each greater than the at least one respective maximum dimension a3 of its at least one intermediate element structure 36 perpendicular to its plane of symmetry 38. Therefore, in each of support structures 20a and 20b, a linear length of a boundary of its contact region/anchoring region with diaphragm 12 (on inner diaphragm side 12a) is increased markedly in comparison with the related art, due to the design of the support structures 20a and 20b described here. Thus, each of support structures 20a and 20b provides markedly more "surface of action" to mechanical stresses, which occur in diaphragm 12, adjacent to respective support structure 20a or 20b, which means that the mechanical stresses are reduced and consequently result less often in damage to diaphragm 12, in particular, result less often in rupturing of diaphragm 12. First maximum dimension a1 of respective, first edge element structure 32 of each of support structures 20a and 20b and/or second maximum dimension a2 of respective, second edge element structure 34 of each of support structures 20a and 20b are preferably in a range of 2 µm (micrometers) to 20 µm (micrometers). Specific, maximum dimension a3 of the at least one intermediate element structure 36 of each of support structures 20a and 20b may be, e.g., in a range of 0.5 µm (micrometers) to 2 µm (micrometers).

First support structures 20a are advantageously situated, in each instance, adjacent to self-supporting region 24 of diaphragm 12 in such a manner, that in each of first support structures 20a, adjacent, self-supporting region 24 lies on a side of its first edge element structure 32 pointed away from its at least one intermediate element structure 36. Thus, the comparatively large, first maximum dimension a1 of first edge element structure 32 ensures a comparatively long face/end face of respective, first support structure 20a, which is oriented towards self-supporting region 24 of diaphragm 12. Consequently, the mechanical stresses occurring in specific "inner" boundary region 30a are spread out over a comparatively large "surface of action," which means that a local intensity of the mechanical stresses on the side of first edge element structure 32 pointed away from its at least one intermediate element structure 36 remains comparatively low.

In addition, at least one of the first support structures 20a is situated adjacent to an outer region of diaphragm 12, such as the diaphragm edge on frame structure 22, in such a manner, that in the at least one first support structure 20a, the adjacent outer region lies on a side of its second edge element structure 34 pointed away from its at least one intermediate element structure 36. Thus, due to its comparatively large, second dimension a2 perpendicular to plane of symmetry 38, second edge element structure 34 also provides a comparatively large face/end face for a mechanical stress occurring in the "outer" boundary region 30b between the outer region of diaphragm 12 and respective support element 20a. Therefore, a local intensity of mechanical stresses in "outer" boundary region 30b between the outer region of diaphragm 12 and the at least one support structure 20a remains comparatively low.

An advantageous orientation of second support structures 20b is discussed below in detail.

As is apparent in FIG. 1c, in at least one of the first and second support structures 20a and 20b, its at least one intermediate element structure 36 may be connected to its first edge element structure 32 and/or to its second edge element structure 34. In the specific embodiment of FIG. 1a through 1c, the (single) intermediate element structure 36 is connected to the two edge element structures 32 and 34. Alternatively, however, the at least one intermediate element structure 36 and the two associated edge element structures 32 and 34 may also be separated/separate from one another (see, for example, FIG. 2). In the specific embodiment of FIG. 1a through 1c, each first edge element structure 32 of support structures 20a and 20b is, in each instance, a right parallelepiped extending perpendicularly to plane of symmetry 38 with first maximum dimension a1. Accordingly, each second edge element structure 34 of support structures 20a and 20b is also, in each instance, a right parallelepiped extending perpendicularly to plane of symmetry 38 with second maximum dimension a2. In contrast, the (single) intermediate element structure 36 is a right parallelepiped, which extends along plane of symmetry 38, is specularly symmetric with respect to plane of symmetry 38, and whose maximum dimension a3 perpendicular to plane of symmetry 38 is markedly less than its dimensions within plane of symmetry 38. Consequently, support structures 20a and 20b each have a cross section in the shape of an "I" (capital letter I) in a plane oriented parallelly to upper substrate surface 10a of substrate 10.

FIG. 2 through FIG. 15 show schematic representations of further specific embodiments of the micromechanical component.

The micromechanical components represented schematically with the aid of FIG. 2 through FIG. 15 include many of the features of the specific embodiment explained above. Therefore, in the following, only the differences between the micromechanical components of FIG. 2 through FIG. 15 and the specific embodiment of FIG. 1a through 1c are discussed. If not described differently, the micromechanical components of FIG. 2 through FIG. 15 may also include the features of the specific embodiment explained above.

Figure 2:
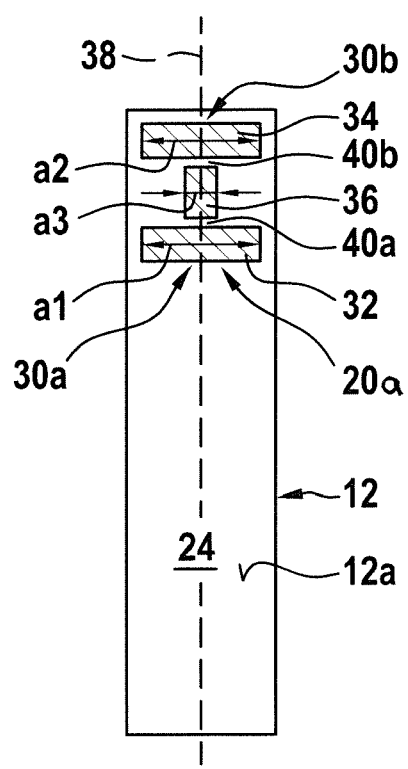

In the micromechanical component represented schematically with the aid of FIG. 2, support structures 20a and 20b differ from those of the specific embodiment described above only in that in each instance, there is a first gap 40a between the (single) intermediate element structure 36 and first edge element structure 32 of the same support structure 20a or 20b, and a second gap 40b between the (single) intermediate element structure 36 and second edge element structure 34 of the same support structure 20a or 20b. Thus, the specific substructures 32 through 36 of each support structure 20a and 20b are separate/separated from each other.

Figure 3:
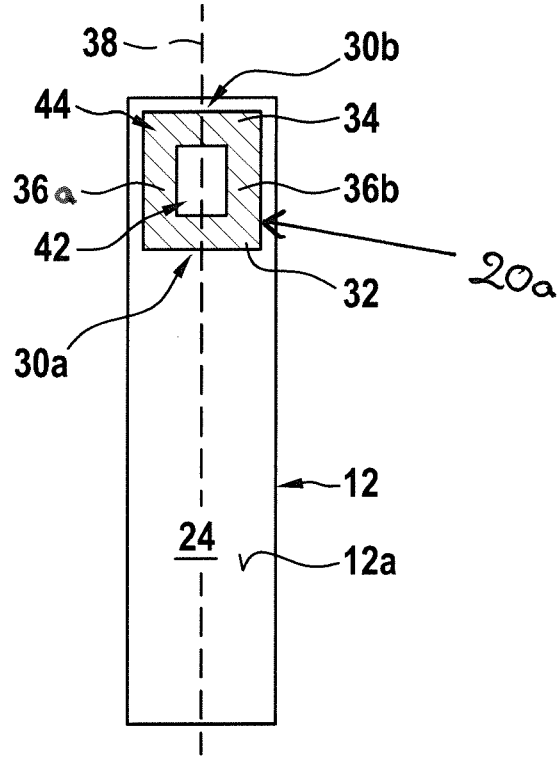

On the micromechanical component represented schematically with the aid of FIG. 3, in the case of at least one of support structures 20a and 20b, its two intermediate element structures 36a and 36b are connected to its first edge element structure 32 and to its second edge element structure 34 in such a manner, that its two intermediate element structures 36a, 36b, its first edge element structure 32, and its second edge element structure 34 frame a hollow space 42 extending from bottom side 14a of cavity 14 to inner diaphragm side 12a. The design of specific support structure 20a or 20b as hollow-space framing 44 bordering the respective hollow space 42 contributes to the increase in the linear length of the boundary of its contact region/anchoring region on diaphragm 12. Accordingly, the support structure 20a or 20b taking the form of hollow-space framing 44 provides mechanical stresses even more "surface of action," which means that a local intensity of the mechanical stresses occurring at the specific support structure 20a or 20b is reduced significantly. Hollow-space framing 44 is preferably specularly symmetric with respect to plane of symmetry 38.

Figure 4:
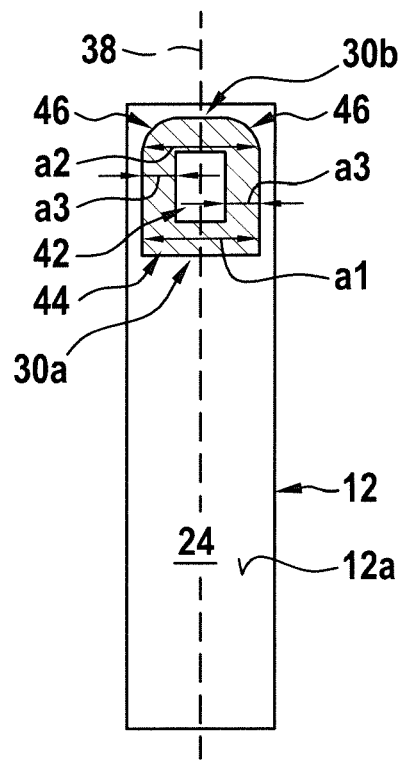

As is apparent in FIG. 4, the at least one support structure 20a or 20b, whose two intermediate element structures 36a and 36b, whose first edge element structure 32, and whose second edge element structure 34 frame respective hollow space 42, may be designed to have at least two round outer edges 46. In the micromechanical component of FIG. 4, for example, round outer edges 46 are formed on the side of its second edge element structure 34 pointing away from intermediate element structures 34.

Figure 5:
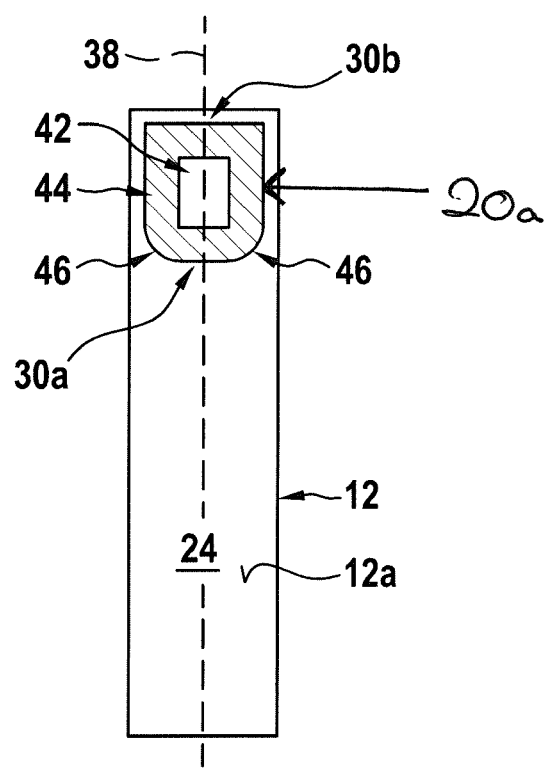
Figure 6:
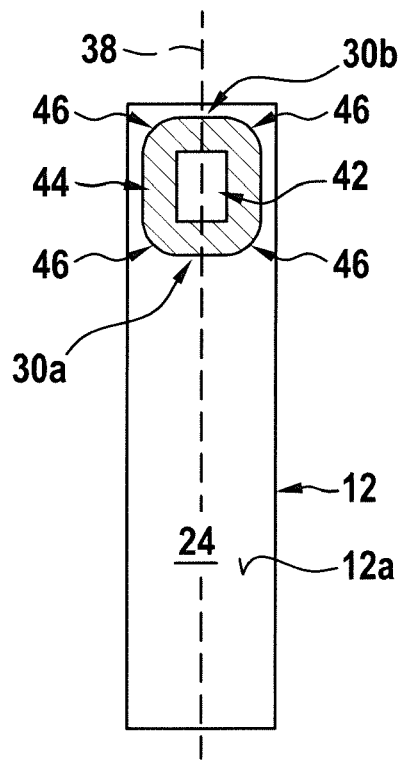

In contrast, the micromechanical component of FIG. 5 includes at least one support structure 20a and 20b, which takes the form of hollow-space framing 44, and in which round outer edges 46 are formed on the side of first edge element structure 32 pointed away from intermediate element structures 36a and 36b. The micromechanical component of FIG. 6 includes at least one support structure 20a and 20b having four round outer edges 46; in each instance, round outer edges 46 being formed on the side of first edge element structure 32 pointed away from intermediate element structures 36a and 36b, and on the side of second edge element structure 34 pointed away from intermediate element structures 36a and 36b. Thus, in a plane oriented parallelly to upper substrate surface 10a of substrate 10, at least one of support structures 20a and 20b of the micromechanical component of FIG. 6 has a cross section in the shape of a rounded-off rectangle.

The specific embodiments described in the following are advantageously suitable, in particular, as second support structures 20b. In this case, second support structures 20b are preferably oriented in such a manner, that the adjacent "outer" electrode suspension boundary region 31 is on a side of its first edge element structure 32 pointing away from its at least one intermediate element structure 36. Due to its comparatively large, first dimension a1 perpendicular to plane of symmetry 38, first edge element structure 32 provides a comparatively large face/end face to a mechanical stress occurring in "outer" electrode suspension boundary region 31. Therefore, a local intensity of mechanical stresses occurring in "outer" electrode suspension boundary region 31 also remains comparatively low.

Figure 7:
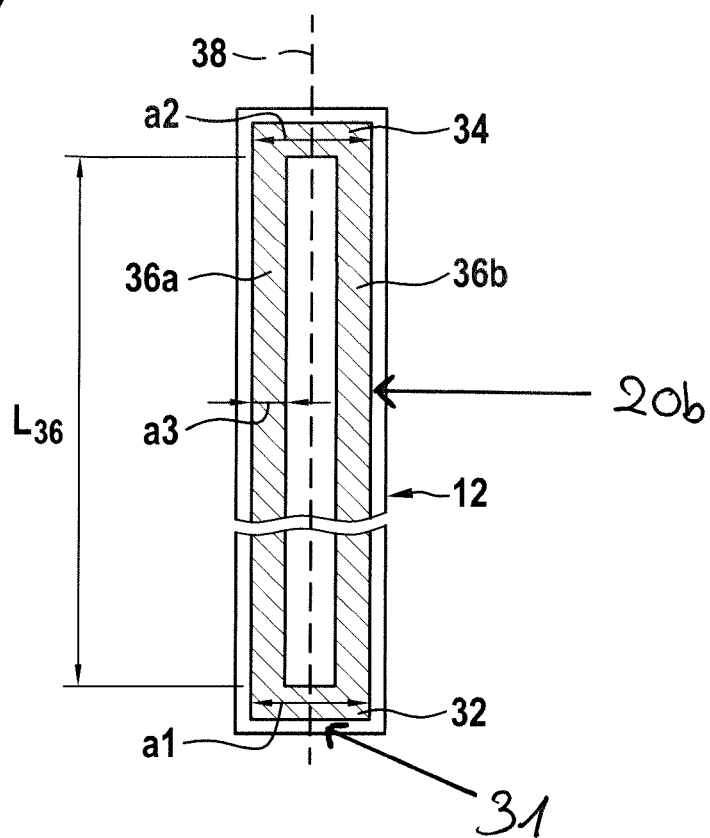

In the micromechanical component schematically represented with the aid of FIG. 7, (at least) second support structures 20b each take the form of hollow-space framing 44. However, in a spatial direction oriented parallelly to upper substrate surface 10a, within plane of symmetry 38, intermediate element structures 36a and 36b have a length $L_{36}$, which is markedly greater than first maximum dimension a1 of its first edge element structure 32 perpendicular to its plane of symmetry 38 and second maximum dimension a2 of its second edge element structure 34 perpendicular to its plane of symmetry 38. Length L36 of intermediate element structures 36a and 36b in the spatial direction oriented parallelly to upper substrate surface 10a within plane of symmetry 38 may be, for example, greater than or equal to 5 µm (micrometers), in particular, greater than or equal to 10 µm (micrometers).

Figure 8:
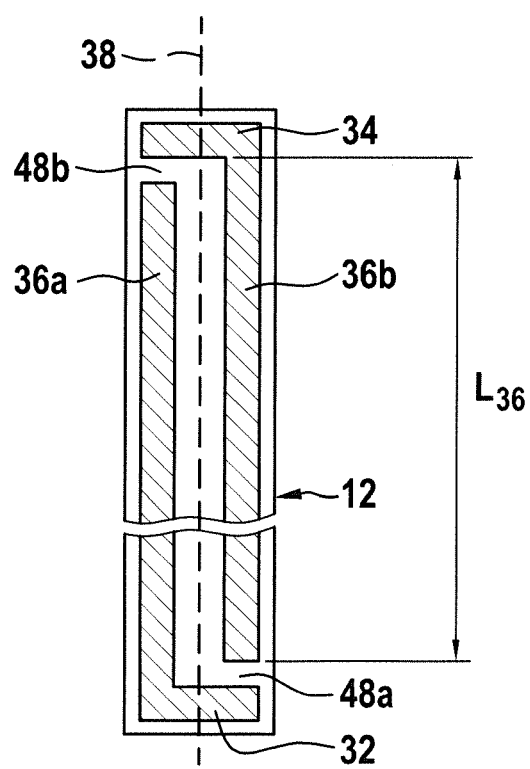

The support structure 20b schematically represented in FIG. 8 only differs from that shown in FIG. 7, in that a first intermediate element structure 36a connected to first edge element structure 32 is spaced apart from second edge element structure 34 by a first gap 48a, while a second intermediate element structure 36b connected to second edge element structure 34 is spaced apart from first edge element structure 32 by a second gap 48b.

Figure 9:
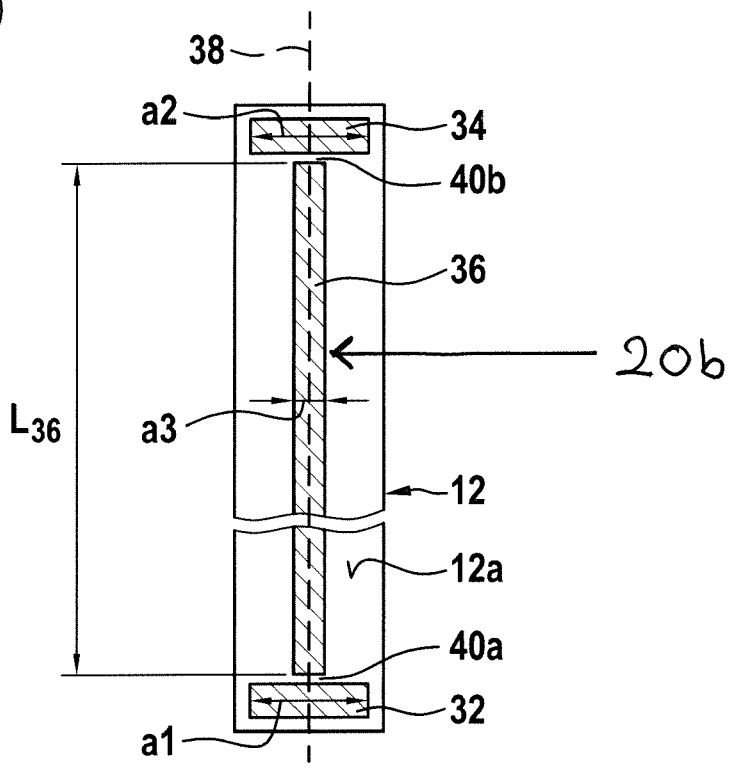
Figure 10:
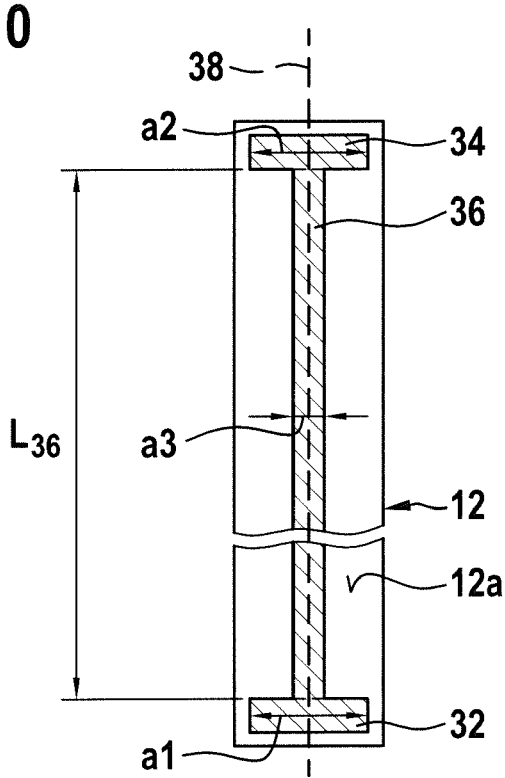

In a plane oriented parallelly to substrate surface 10a of substrate 10, each of support structures 20b represented in FIGS. 9 and 10 also has a cross section in the shape of an "I" (capital letter I). In contrast to the specific embodiments of FIGS. 1c and 2, in a spatial direction oriented parallelly to upper substrate surface 10a, within plane of symmetry 38, the (single) intermediate element structure 36 has a length $L_{36}$, which is markedly greater than first maximum dimension a1 of adjacent, first edge element structure 32 perpendicular to its plane of symmetry 38, and markedly greater than second maximum dimension a2 of adjacent second edge element structure 34 perpendicular to its plane of symmetry 38. In contrast to the specific embodiment of FIG. 10, FIG. 9 shows a support structure 20b, in which in each instance, a first gap 40a is situated between the (single) intermediate element structure 36 and first edge element structure 32 of the same support structure 20b, and a second gap 40b is situated between the (single) intermediate element structure 36 and second edge element structure 34 of the same support structure 20b.

Figure 11:
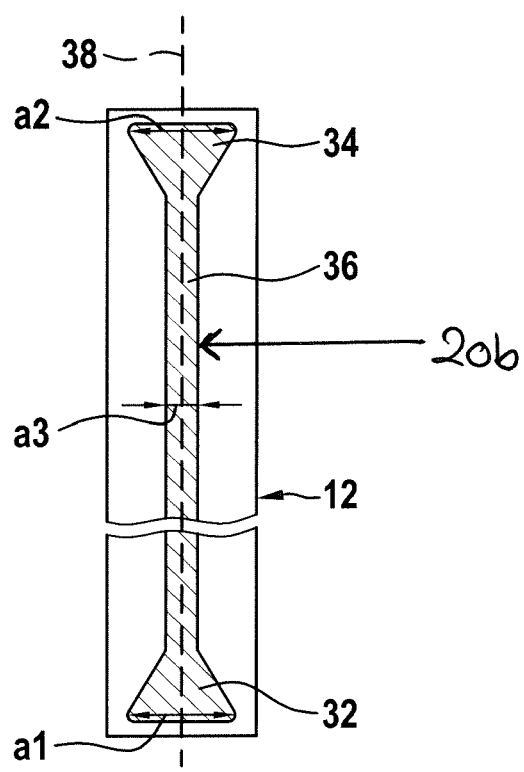
Figure 12:
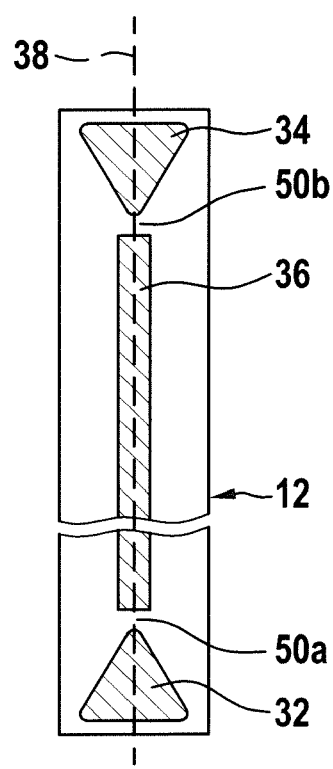

As is shown in FIGS. 11 and 12, first edge element structure 32 and second edge element structure 34 of each support structure 20a and 20b may each be formed in the shape of a (right) prism, as well. In this case, a dimension of the specific (right) prism perpendicular to plane of symmetry 38 decreases in the direction of the (single) intermediate element structure 36 of respective support structure 20a or 20b. In this case, as well, a first gap 50a may optionally be formed between first edge element structure 32 and the (single) intermediate element structure 36 of the same support structure 20a or 20b, and a second gap 50b may optionally be formed between second edge element structure 34 and the (single) intermediate element structure 36 of the same support structure 20a or 20b (see FIG. 12).

Figure 13:
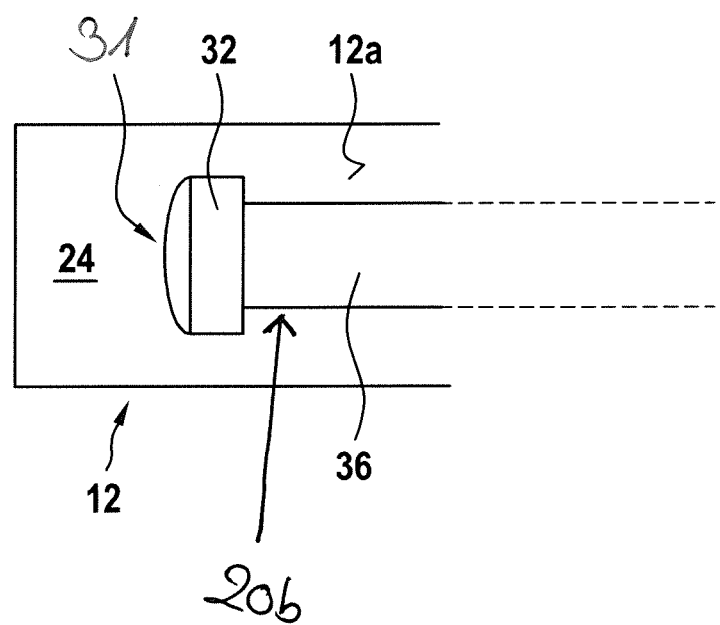

Support structure 20b represented schematically with the aid of FIG. 13 includes a first edge element structure having a protuberance on its side pointing away from the (single) intermediate element structure 36 of same support structure 20b. Therefore, first edge element structure 32 includes a right parallelepiped having a spherical segment formed on the side pointing away from the (single) intermediate element structure 36 of the same support structure 20b. Therefore, first edge element structure 32 is formed in the "shape of a head of a nail." This shape of first edge element structure 32 also contributes towards further increasing its "surface of action" for mechanical stress and consequently reduces the risk of a rupture of diaphragm 12 directly on respective support structure 20a or 20b. As an option, second edge element structure 34 of the same support structure 20a or 20b may be formed in the "shape of the head of a nail," in that second edge element structure 34 includes a right parallel piped having a spherical segment on the side pointed away from the (single) intermediate element structure 36 of the same support structure 20a or 20b. Edge element structures 32 and 34 may also be separated from the (single) intermediate element structure 36 of the same support structure 20a or 20b (by at least a gap).

In the micromechanical components schematically represented with the aid of FIGS. 14 and 15, at least one of the second support structures 20b and another of the second support structures 20b are oriented with respect to each other in such a manner, that their second edge element structures 34 are aligned with each other; a support wall structure 52 extending from bottom side 14a of cavity 14 to inner diaphragm side 12a being formed between their second edge element structures. In a direction oriented parallelly to upper substrate surface 10a, within plane of symmetry 38, support wall structure 52 preferably has a length $L_{52}$, which is markedly greater than first maximum dimension a1 and second maximum dimension a2. Length $L_{52}$ of support wall structure 52 in the spatial direction oriented parallelly to upper substrate surface 10a, within plane of symmetry 38, may be, for example, greater than or equal to 10 μm (micrometers), in particular, greater than or equal to 15 μm (micrometers). Support wall structure 52 may optionally be connected to at least one of adjacent support structures 20b (FIG. 14). Alternatively, a first gap 54a may be situated between adjacent support structure 20b and support wall structure 52, and a second gap 54b may be situated between further, adjacent support structure 20b and support wall structure 52.

Regarding further characteristics and features of the micromechanical components schematically represented by FIG. 2 through 15, reference is made to the specific embodiment of FIG. 1a through 1c.

The above-described shapes of support structures 20a and 20b may also be "combined" with each other in such a manner, that a micromechanical component has different shapes of support structures 20a and 20b.

In comparison with the related art, all of the support structures 20a and 20b described above provide an increase in their linear length of the boundary of their region of contact/anchoring with diaphragm 12 (on the inner diaphragm side 12a). In other words, this may also be referred to as an increase in the linear length for contacting the diaphragm. By increasing the linear length for the contacting of the diaphragm by support elements 20, a local intensity of the mechanical stresses at the boundary of their region of contact with/anchoring to diaphragm 12 is reduced. In this manner, a risk of forming a rupture in diaphragm 12 is reduced in comparison with the related art. Support structures 20a and 20b may also include at least two intermediate element structures 36, 36a or 36b positioned in a row oriented along or parallelly to plane of symmetry 38.

The micromechanical components described above may each be used in a capacitive pressure sensor device. In addition, the capacitive pressure sensor device preferably includes evaluation electronics, which are configured to determine and output a measured value regarding the physical pressure p prevailing, in each instance, on outer diaphragm side 12b, in view of at least the voltage tapped off between counter-electrode 26 and measuring electrode 28.

Figure 16:
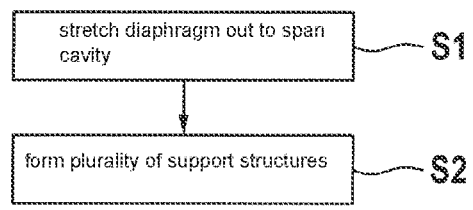
FIG. 16 shows a flow chart for explaining a specific embodiment of the method for manufacturing a micromechanical component, in accordance with the present invention.

FIG. 16 shows a flow chart for explaining a specific embodiment of the method for manufacturing a micromechanical component.

The manufacturing method includes at least one method step S1, in which, on a substrate having an upper substrate surface, a diaphragm is stretched out in such a manner, that the diaphragm spans a cavity situated between the diaphragm and the upper substrate surface, so as to be spaced apart from a bottom side of the cavity pointing away from the diaphragm. In a method step S2, a plurality of support structures are formed, which each extend from an inner diaphragm side 12a of the diaphragm to the bottom side of the cavity and/or from the inner diaphragm side to a measuring electrode suspended on the diaphragm. Method step S2 may be executed simultaneously to, or temporally overlapping with, method step S1. Method step S2 may also be executed before or after method step S1.

In addition, each of the support structures is formed to have, in each instance, a first edge element structure, a second edge element structure, and at least one intermediate element structure situated between the associated, first edge element structure and the associated, second edge element structure, so that for each of the support structures, in each instance, a plane of symmetry is definable, with respect to which at least the first edge element structure of the respective support structure and the second edge element structure of the respective support structure are specularly symmetric. In addition, in each instance, the substructures of each of the support structures are formed in such a manner, that in each of the support structures, a first maximum dimension of its first edge element structure perpendicular to its plane of symmetry and a second maximum dimension of its second edge element structure perpendicular to its plane of symmetry are greater than the at least one maximum dimension of its at least one intermediate element structure perpendicular to its plane of symmetry.

What is claimed is:

1. A micromechanical component, comprising:
   a substrate having an upper substrate surface;
   a diaphragm, which spans a cavity lying between the diaphragm and the upper substrate surface, so as to be spaced apart from a bottom side of the cavity pointed away from the diaphragm; and
   a plurality of support structures, which each extend from an inner diaphragm side of the diaphragm to the bottom side of the cavity and/or from the inner diaphragm side to a measuring electrode suspended on the diaphragm;
   wherein each support structure of the support structures includes, in each instance, a first edge element structure, a second edge element structure, and at least one intermediate element structure positioned between the first edge element structure of the support structure and the second edge element structure of the support structure; for each respective support structure of the support structures, in each instance, a respective plane of symmetry is definable, with respect to which at least the first edge element structure of the respective support structure and the second edge element structure of the respective support structure are specularly symmetric; and in each respective support structure of the support structures, a first maximum dimension of the first edge element structure of the respective support structure perpendicular to the respective plane of symmetry of the respective support structure and a second maximum dimension of the second edge element structure of the respective support structure perpendicular to the respective plane of symmetry of the respective support structure are greater than a respective at least one maximum dimension of the at least one intermediate element structure of the respective support structure perpendicular to the respective plane of symmetry of the respective support structure.

2. The micromechanical component as recited in claim 1, wherein the support structures extending from the inner diaphragm side to the bottom side of the cavity are each situated adjacent to a self-supporting region of the diaphragm in such a manner, that in each respective support structure of the support structures, an adjacent, self-supporting region lies on a side of the first edge element structure of the respective support structure pointed away from the at least one intermediate element structure of the respective support structure.

3. The micromechanical component as recited in claim 2, wherein at least one of the support structures extending from the inner diaphragm side to the bottom side of the cavity is positioned adjacent to an outer region of the diaphragm in such a manner, that with respect to the at least one support structure, the adjacent outer region lies on a side of the second edge element structure of the as least one support structure pointed away from the at least one intermediate element structure of the at least one support structure.

4. The micromechanical component as recited in claim 1, wherein at least a first support structure of the support structures extending from the inner diaphragm side to the measuring electrode and a second support structure of the support structures extending from the inner diaphragm side to the measuring electrode are aligned with each other in such a manner, that the second edge element structures of the first and second support structures are aligned with each other; and a support wall structure extending from the bottom side of the cavity to the inner diaphragm side is formed between the second edge element structures of the first and second support structures.

5. The micromechanical component as recited in claim 1, wherein in at least one of the support structures, the at least one intermediate element structure of the at least one of the support structures is connected to the first edge element structure of the at least one of the support structures, and/or to the second edge element structure of the at least one of the support structures.

6. The micromechanical component as recited in claim 5, wherein the at least one intermediate element structure of the at least one of the support structures has two intermediate element structures, and wherein in the at least one of the support structures, the two intermediate element structures are connected to the first edge element structure of the at least one of the support structures and to the second edge element structure of the at least one of the support structures in such a manner, that the two intermediate element structure, the first edge element structure of the at least one of the support structures, and the second edge element structure of the at least one of the support structures frame a hollow space extending from the bottom side of the cavity to the inner diaphragm side.

7. The micromechanical component as recited in claim 6, wherein the at least one of the support structures, whose two intermediate element structures, whose first edge element structure, and whose second edge element structure frame the hollow space, are formed to have at least two round outer edges.

8. The micromechanical component as recited in claim 1, wherein the cavity is sealed so air-tightly to have a reference pressure present in the cavity, that the diaphragm may be deformed at least partially with the aid of a physical pressure unequal to the reference pressure, on an outer diaphragm side of the diaphragm pointed away from the cavity; and a counter-electrode situated on the bottom side of the cavity, and the measuring electrode, are electrically contactable in such a manner, that a voltage applied between the counter-electrode and the measuring electrode may be tapped off.

9. A capacitive pressure sensor device, comprising:
   a micromechanical component, including:
      a substrate having an upper substrate surface;
      a diaphragm, which spans a cavity lying between the diaphragm and the upper substrate surface, so as to be spaced apart from a bottom side of the cavity pointed away from the diaphragm; and
      a plurality of support structures, which each extend from an inner diaphragm side of the diaphragm to the bottom side of the cavity and/or from the inner diaphragm side to a measuring electrode suspended on the diaphragm;
   wherein each support structure of the support structures includes, in each instance, a first edge element structure, a second edge element structure, and at least one intermediate element structure positioned between the first edge element structure of the support structure and the second edge element structure of the support structure; for each respective support structure of the support structures, in each instance, a respective plane of symmetry is definable, with respect to which at least the first edge element structure of the respective support structure and the second edge element structure of the respective support structure are specularly symmetric; and in each respective support structure of the support structures, a first maximum dimension of the first edge element structure of the respective support structure perpendicular to the respective plane of symmetry of the respective support structure and a second maximum dimension of the second edge element structure of the respective support structure perpendicular to the respective plane of symmetry of the respective support structure are greater than a respective at least one maximum dimension of the at least one intermediate element structure of the respective support structure perpendicular to the respective plane of symmetry of the respective support structure,
   wherein the cavity is sealed so air-tightly to have a reference pressure present in the cavity, that the diaphragm may be deformed at least partially with the aid of a physical pressure unequal to the reference pressure, on an outer diaphragm side of the diaphragm pointed away from the cavity; and a counter-electrode situated on the bottom side of the cavity, and the measuring electrode, are electrically contactable in such a manner, that a voltage applied between the counter-electrode and the measuring electrode may be tapped off; and
   evaluation electronics, which are configured to determine and output a measured value regarding the physical pressure prevailing, in each instance, on the outer diaphragm side, in view of at least the voltage tapped off between the counter-electrode and the measuring electrode.

10. A method for manufacturing a micromechanical component, comprising the following steps:
- stretching out a diaphragm on a substrate having an upper substrate surface, in such a manner, that the diaphragm spans a cavity lying between the diaphragm and the upper substrate surface, so as to be spaced apart from a bottom side of the cavity pointed away from the diaphragm; and
- forming a plurality of support structures, which each extend from an inner diaphragm side of the diaphragm to the bottom side of the cavity and/or from the inner diaphragm side to a measuring electrode suspended on the diaphragm, wherein each; wherein each support structure of the support structures is formed to have, in each instance, a first edge element structure, a second edge element structure, and at least one intermediate element structure positioned between the first edge element structure of the support structure and the second edge element structure of the support structure; for each respective support structure of the support structures, in each instance, a respective plane of symmetry is definable, with respect to which at least the first edge element structure of the respective support structure and the second edge element structure of the respective support structure are specularly symmetric; and in each respective support structure of the support structures, a first maximum dimension of the first edge element structure of the respective support structure perpendicular to the respective plane of symmetry of the respective support structure and a second maximum dimension of the second edge element structure of the respective support structure perpendicular to the respective plane of symmetry of the respective support structure are greater than a respective at least one maximum dimension of the at least one intermediate element structure of the respective support structure perpendicular to the respective plane of symmetry of the respective support structure.

* * * * *